(12) United States Patent
Utsunomiya et al.

(10) Patent No.: US 7,199,844 B2
(45) Date of Patent: Apr. 3, 2007

(54) QUADRATIC NYQUIST SLOPE FILTER

(75) Inventors: Kimitake Utsunomiya, Sunnyvale, CA (US); Takatsugu Kamata, Santa Clara, CA (US)

(73) Assignee: RfStream Corporation, Osaka (JP)

( * ) Notice: Subject to any disclaimer, the term of this patent is extended or adjusted under 35 U.S.C. 154(b) by 561 days.

(21) Appl. No.: 10/262,514

(22) Filed: Sep. 30, 2002

(65) Prior Publication Data

US 2003/0223017 A1   Dec. 4, 2003

Related U.S. Application Data

(60) Provisional application No. 60/383,937, filed on May 28, 2002.

(51) Int. Cl.
*H04N 5/455* (2006.01)
(52) U.S. Cl. .................................... 348/726
(58) Field of Classification Search ............... 348/726, 348/473, 475, 725, 728, 729; 375/296
See application file for complete search history.

(56) References Cited

U.S. PATENT DOCUMENTS

| | | | |
|---|---|---|---|
| 1,735,742 A | 11/1929 | Fetter | |
| 2,140,770 A | 12/1938 | Schofield | |
| 2,325,174 A | 7/1943 | Cooper | |
| 2,464,557 A | 3/1949 | Crockett | |
| 2,496,177 A | 1/1950 | Richards et al. | |
| 2,531,312 A | 11/1950 | Loon | |
| 2,549,789 A | 4/1951 | Ferrill | |
| 2,796,524 A | 6/1957 | Ferrill | |
| 2,801,341 A | 7/1957 | Jaffe | |
| 3,252,096 A | 5/1966 | Carlson | |
| 3,400,345 A | 9/1968 | Oloff | |
| 3,488,595 A | 1/1970 | Vasile | |
| 3,509,500 A | 4/1970 | McNair et al. | |
| 3,544,903 A | 12/1970 | Sakamoto | |
| 3,686,575 A | 8/1972 | Chamberlain | |
| 3,794,941 A | 2/1974 | Templin | |
| 3,906,350 A * | 9/1975 | Musiak | 455/67.11 |

(Continued)

FOREIGN PATENT DOCUMENTS

EP   0 392 449 A1   10/1990

(Continued)

*Primary Examiner*—Paulos M. Natnael
(74) *Attorney, Agent, or Firm*—Stattler Johansen & Adeli LLP

(57) ABSTRACT

A television demodulator circuit, for use in a television receiver, generates baseband video and audio outputs from a television signal, such as an intermediate frequency television signal. The I, Q demodulator circuit mixes the television signal with an in-phase ("I") local oscillator signal and a quadrature phase ("Q") local oscillator signal at the tuned frequency to generate baseband I and Q signals. The baseband I and Q signals are input to low pass filters and a Nyquist slope filter. The Nyquist slope filter generates, for the baseband I and Q signals, a Nyquist slope response and attenuates channels adjacent to the tuned television channel. The Nyquist slope filter comprises a transfer function with at least two zero crossings, so as to provide a notch filter response for attenuation of a television channel adjacent to the tuned television channel. For example, the transfer function may have three zero crossings to attenuate a sound carrier frequency, a color carrier frequency, and a picture frequency for the television channel adjacent to the tuned television channel. The transfer function, expressed in the S domain, comprises an all-pass fractional transfer function with a real number in the numerator and a complex number in the denominator. A television receiver that incorporates the I, Q demodulator circuit is disclosed.

11 Claims, 7 Drawing Sheets

U.S. PATENT DOCUMENTS

| | | | |
|---|---|---|---|
| 3,931,578 A | | 1/1976 | Gittinger |
| 4,112,378 A | | 9/1978 | Ito et al. |
| 4,118,679 A | | 10/1978 | Hiday et al. |
| 4,138,654 A | | 2/1979 | Luhowy |
| 4,296,391 A | | 10/1981 | Hazama et al. |
| 4,333,079 A | * | 6/1982 | Dick et al. ............... 342/68 |
| 4,379,271 A | | 4/1983 | Lehmann |
| 4,456,895 A | | 6/1984 | Landt et al. |
| 4,514,763 A | | 4/1985 | Rindal |
| 4,555,809 A | | 11/1985 | Carlson |
| 4,598,423 A | | 7/1986 | Hettiger |
| 4,785,253 A | | 11/1988 | Hughes |
| 4,789,897 A | * | 12/1988 | Kappeler et al. ............ 348/726 |
| 4,812,851 A | | 3/1989 | Giubardo |
| 4,818,903 A | | 4/1989 | Kawano |
| 4,882,614 A | * | 11/1989 | Kageyama et al. .... 375/240.01 |
| 4,910,798 A | * | 3/1990 | Boardman ............... 455/295 |
| 4,970,479 A | | 11/1990 | Landt et al. |
| 4,985,769 A | * | 1/1991 | Yasumoto et al. ........ 348/433.1 |
| 4,988,902 A | | 1/1991 | Dingwall |
| 5,077,542 A | * | 12/1991 | Lanoiselee ............... 332/151 |
| 5,122,868 A | * | 6/1992 | Isnardi ................. 348/584 |
| 5,146,337 A | | 9/1992 | Grubbs |
| 5,146,338 A | | 9/1992 | Lehmann et al. |
| 5,148,280 A | | 9/1992 | Wignot et al. |
| 5,155,580 A | * | 10/1992 | Gibson et al. ............ 348/618 |
| 5,187,445 A | | 2/1993 | Jackson |
| 5,287,180 A | * | 2/1994 | White ................. 348/484 |
| 5,386,239 A | * | 1/1995 | Wang et al. ............ 348/472 |
| 5,491,715 A | | 2/1996 | Flaxl |
| 5,519,265 A | | 5/1996 | Latham |
| 5,525,940 A | | 6/1996 | Heikkila et al. |
| 5,663,773 A | * | 9/1997 | Goeckler ............... 348/726 |
| 5,737,035 A | | 4/1998 | Rotzoll |
| 5,898,900 A | | 4/1999 | Richter et al. |
| 5,905,398 A | | 5/1999 | Todsen et al. |
| 5,912,829 A | * | 6/1999 | Maier .................. 708/404 |
| 5,914,633 A | | 6/1999 | Comino et al. |
| 6,016,170 A | | 1/2000 | Takayama et al. |
| 6,094,236 A | | 7/2000 | Abe et al. |
| 6,169,569 B1 | | 1/2001 | Widmer et al. |
| 6,177,964 B1 | | 1/2001 | Birleson |
| 6,219,376 B1 | | 4/2001 | Zhodzishsky et al. |
| 6,226,509 B1 | | 5/2001 | Mole et al. |
| 6,243,567 B1 | | 6/2001 | Saito |
| 6,256,495 B1 | | 7/2001 | Francisco et al. |
| 6,275,113 B1 | | 8/2001 | Nakano et al. |
| 6,304,619 B1 | * | 10/2001 | Citta et al. ............. 375/343 |
| 6,307,443 B1 | | 10/2001 | Gabara |
| 6,324,233 B1 | | 11/2001 | Sempel et al. |
| 6,424,206 B2 | | 12/2001 | Takahashi et al. |
| 6,351,293 B1 | | 2/2002 | Perlow |
| 6,359,940 B1 | | 3/2002 | Ciccarelli et al. |
| 6,377,315 B1 | | 4/2002 | Carr et al. |
| 6,424,209 B1 | | 7/2002 | Gorecki et al. |
| 6,470,055 B1 | * | 10/2002 | Feher .................. 375/259 |
| 6,535,075 B2 | | 3/2003 | Frech et al. |
| 6,535,722 B1 | | 3/2003 | Rosen et al. |
| 6,538,521 B2 | | 3/2003 | Kobayashi et al. |
| 6,593,828 B1 | | 7/2003 | Helfenstein et al. |
| 6,597,748 B1 | | 7/2003 | Hietala et al. |
| 6,628,728 B1 | * | 9/2003 | McCarty, Jr. ............ 375/296 |
| 6,631,256 B2 | | 10/2003 | Suominen |
| 6,636,085 B2 | | 10/2003 | Okazaki et al. |
| 6,657,678 B1 | | 12/2003 | Mizukami et al. |
| 6,667,649 B1 | | 12/2003 | Lee |
| 6,725,463 B1 | | 4/2004 | Birleson |
| 6,750,734 B2 | | 6/2004 | Utsunomiya et al. |
| 6,778,022 B1 | | 8/2004 | Zhang et al. |
| 6,778,594 B1 | | 8/2004 | Liu |
| 6,882,245 B2 | | 4/2005 | Utsunomiya et al. |
| 6,940,365 B2 | | 9/2005 | Kamata et al. |
| 2002/0050861 A1 | | 5/2002 | Nguyen et al. |
| 2003/0053562 A1 | * | 3/2003 | Busson et al. ............ 375/322 |
| 2003/0097601 A1 | | 5/2003 | Glas et al. |
| 2003/0186671 A1 | | 10/2003 | Prodanov et al. |
| 2003/0197810 A1 | * | 10/2003 | Jaffe ................. 348/726 |

FOREIGN PATENT DOCUMENTS

| | | |
|---|---|---|
| EP | 0 676 880 A2 | 10/1995 |
| EP | 0 707 379 A1 | 4/1996 |
| WO | WO 95 22839 A2 | 8/1995 |
| WO | WO 01 06637 A1 | 1/2001 |
| WO | WO 01 28310 A2 | 4/2001 |

* cited by examiner

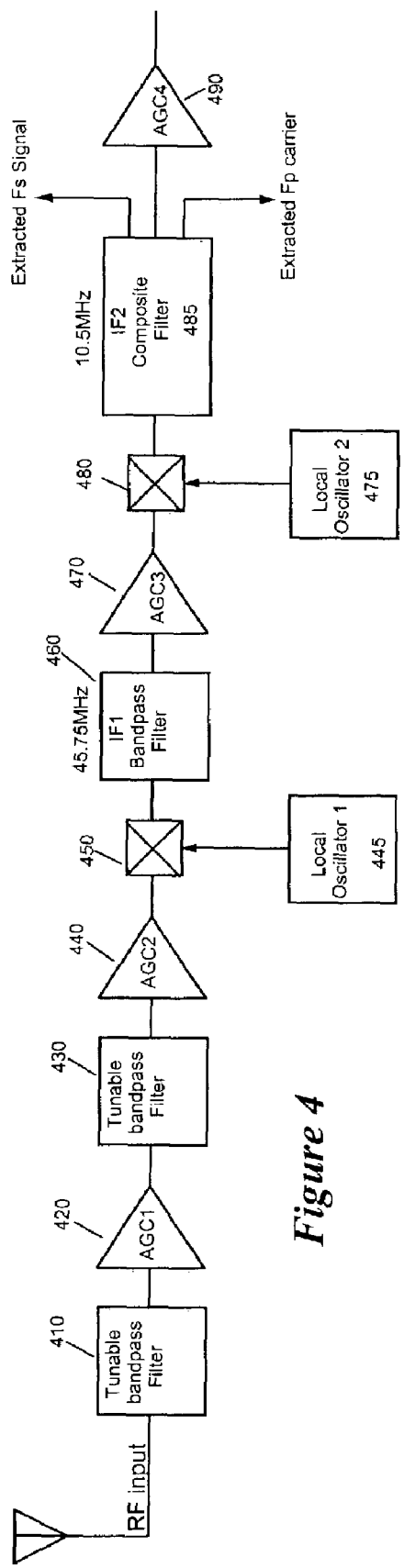
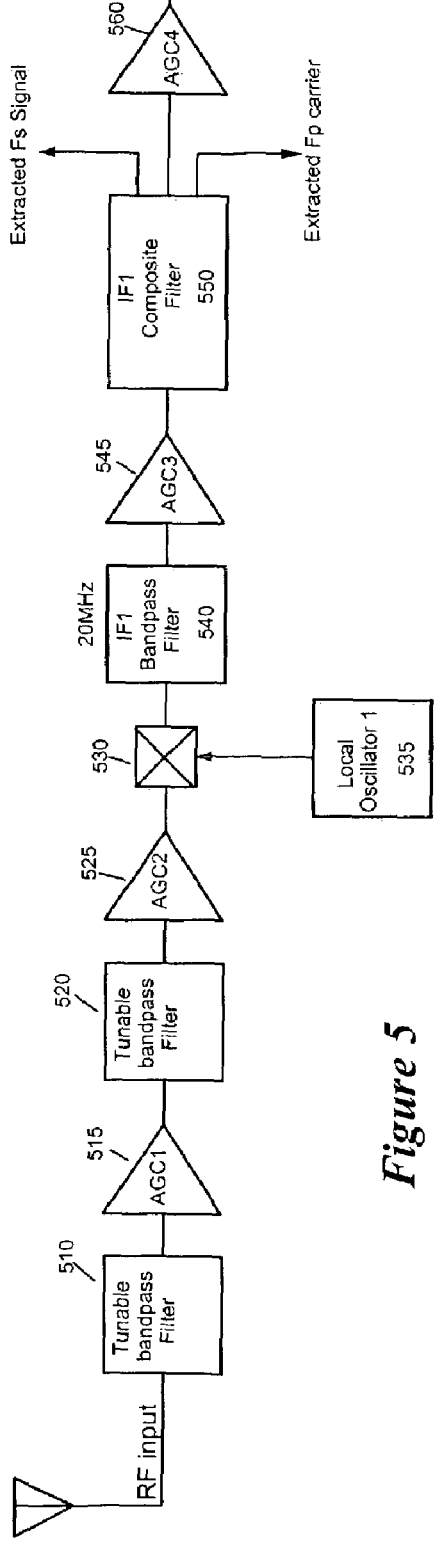
Figure 4
Figure 5

QUADRATIC NYQUIST SLOPE FILTER

CROSS-REFERENCES TO RELATED APPLICATIONS

This application claims the benefit of U.S. Provisional Patent Application No. 60/383,937, filed May 28, 2002, entitled "Quadratic Nyquist Slope Filter For A Television Receiver."

BACKGROUND OF THE INVENTION

1. Field of the Invention

The present invention is directed toward the field of television tuning, and more particularly toward a baseband filter for demodulating a television signal.

2. Art Background

In general, televisions include circuits to demodulate radio frequency television signals to generate video and sound signals. The video and sound signals provide the information necessary to form the television picture and sound, respectively. An ultrahigh frequency ("UHF")/very high frequency ("VHF") tuner is one type of circuit found in television receivers. In general, the UHF/VHF tuner receives a radio frequency ("RF") television signal that includes a plurality of channels. The channels are modulated on a carrier frequency. The carrier frequency may be in the UHF spectrum or the VHF spectrum. The television is set or tuned to receive a specific channel (e.g., channel 2). The U/V tuner processes the RF television signal based on the channel selected, and generates an intermediate frequency ("IF") signal. In the United States, the intermediate frequency, used in television receivers, is set to a frequency of 45.75 Mhz.

Television receivers also include circuits to perform intermediate frequency processing. These IF television circuits typically employ surface acoustic wave ("SAW") filters. The SAW filter conditions the IF signal prior to demodulation (i.e., prior to extracting the video and audio signals). The SAW filter rejects or suppresses the energy bands associated with channels adjacent to the desired channel (i.e., the selected channel). To this end, the SAW filter provides a Nyquist slope bandpass response for the IF signal.

FIG. 1 is a block diagram illustrating one embodiment for a prior art television receiver. As shown in FIG. 1, the U/V tuner 110 conditions and converts the RF signal at the tuning frequency to the intermediate frequency (IF) signal. The IF signal is input to the SAW filter 120. The output signal from SAW filter 120 is input to an IF processor 130. In general, IF processor 130 demodulates the television signal to generate baseband video and audio signals.

As discussed above, the SAW filter provides a Nyquist slope response. FIG. 2a illustrates various Nyquist slope responses. As shown in FIG. 2a, slope 200 depicts the ideal Nyquist slope. Note that the ideal Nyquist slope crosses at the picture frequency ($F_p$) at 0.5 of the maximum energy of the filter response. FIG. 2a also shows two non-ideal Nyquist slopes. As shown in FIG. 2a, the response of slope 210 crosses the picture frequency ($F_p$) at a lower point than the ideal Nyquist slope (i.e., slope 200). Conversely, slope 220 crosses the picture frequency ($F_p$) at a point higher than the ideal Nyquist slope.

FIG. 2b illustrates various waveform responses as a result of the SAW filter. The ideal waveform response, waveform 230, is a result of the SAW filter providing an ideal Nyquist slope (i.e., slope 200 of FIG. 2a). The waveform response 240, which includes additional out of band energy, is a result of the non-ideal Nyquist slope 210 shown in FIG. 2a. Also, waveform response 250, which filters the signal in the information band, is a result of the non-ideal Nyquist slope 220 of FIG. 2a.

When using a SAW filter in the television receiver, the non-ideal Nyquist slopes (210 and 220, FIG. 2a) and corresponding waveform responses (240 and 250, FIG. 2b) are a result of off tuning. Specifically, if the SAW filter is not tuned to filter at the appropriate center frequency, shifts in the Nyquist slope (e.g., Nyquist slopes 210 and 220) occur. In turn, this off tuning of the SAW filter provides the undesirable waveform responses (e.g., waveforms 240 and 250, FIG. 2b).

Also, as shown in FIG. 1, the television circuit includes the automatic frequency tracking detection circuit 140. In general, the automatic frequency tracking (AFT) detection circuit 140 determines, based on the baseband audio and video signals, an offset between the actual carrier frequency of the tuned signal and the frequency of the local oscillators in the television receiver. For example, the television receiver circuit may process a signal input with a carrier frequency of 90 MHz. For this example, the AFT detection circuit 140 may generate an offset of 0.2 Mhz (i.e., the actual carrier frequency is 0.2 Mhz different than the frequency of the local oscillator in the television receiver.) Based on the feedback, the UV tuner circuit 110 compensates for the offset to more accurately track the carrier frequency. In addition, as shown in FIG. 1, the AFT detection circuit 140 provides tracking information to SAW filter 120. Specifically, the tracking information tunes the SAW filter 120 to provide a frequency response centered around the tracked IF frequency.

It is advantageous to generate a Nyquist slope response in a filter that eliminates the undesirable characteristics introduced through use of a SAW filter.

SUMMARY OF THE INVENTION

A television demodulator circuit, for use in a television receiver, generates baseband video and audio outputs. An I, Q demodulator circuit receives a television signal (e.g., intermediate frequency signal) for demodulation. The I, Q demodulator circuit mixes the television signal with an in-phase ("I") local oscillator signal and a quadrature phase ("Q") local oscillator signal at the tuned frequency (i.e., the frequency for the channel that the television is currently tuned) to generate baseband I and Q signals. The baseband I and Q signals are conditioned by filters. In one embodiment, the baseband I and Q signals are input to low pass filters and a Nyquist slope filter. The Nyquist slope filter generates, for the baseband I and Q signals, a Nyquist slope response and attenuates channels adjacent to the tuned television channel.

In one embodiment, Nyquist slope filter comprises a transfer function with at least two zero crossings, so as to provide a notch filter response for attenuation of a television channel adjacent to the tuned television channel. For example, the transfer function for the Nyquist slope filter may comprise a zero crossing at the sound carrier frequency for the television channel adjacent to the tuned television channel. In another embodiment, the transfer function has three zero crossings to attenuate a sound carrier frequency, a color carrier frequency, and a picture frequency for the television channel adjacent to the tuned television channel (e.g., the television channel at a lower frequency). In one implementation for the Nyquist slope filter, the transfer function, expressed in the S domain, comprises an all-pass fractional transfer function with a real number in the numerator and a complex number in the denominator. The Nyquist slope filter comprises inverters so that the transfer function includes only terms in the numerator with the same sign.

In one embodiment, the demodulator circuit is incorporated into a television receiver. The television receiver includes a downconverter circuit for processing an input radio frequency ("RF") television signal suitable for input to the demodulator circuit. In one embodiment, the downconverter circuit utilizes a double down conversion scheme. In a second embodiment, the downconverter circuit utilizes a single down conversion scheme

BRIEF DESCRIPTION OF THE DRAWINGS

FIG. 4 is a block diagram illustrating one embodiment for the U/V tuner in the television receiver.

FIG. 5 is a block diagram illustrating another embodiment for the U/V tuner.

DETAILED DESCRIPTION

The disclosure of U.S. Provisional Patent Application 60/383,937, filed May 28, 2002, entitled "Quadratic Nyquist Slope Filter For A Television Receiver" is hereby expressly incorporated herein by reference.

Figure 1:
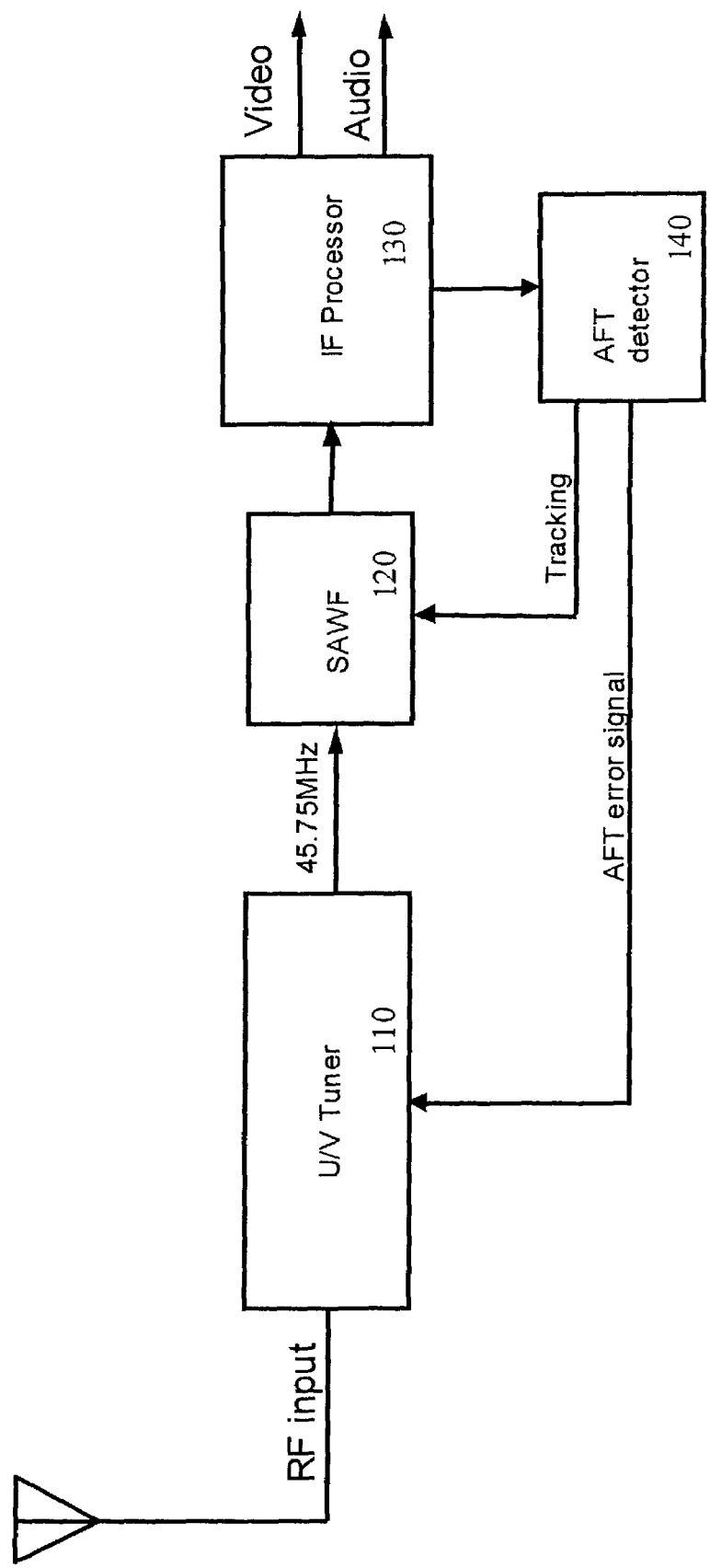
FIG. 1 is a block diagram illustrating one embodiment for a prior art television receiver.
Figure 2A:
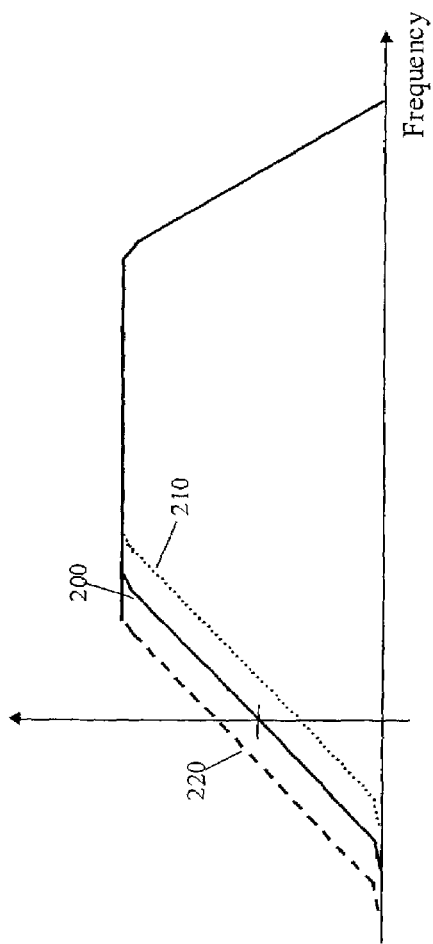
FIG. 2a illustrates various Nyquist slope responses.
Figure 2B:
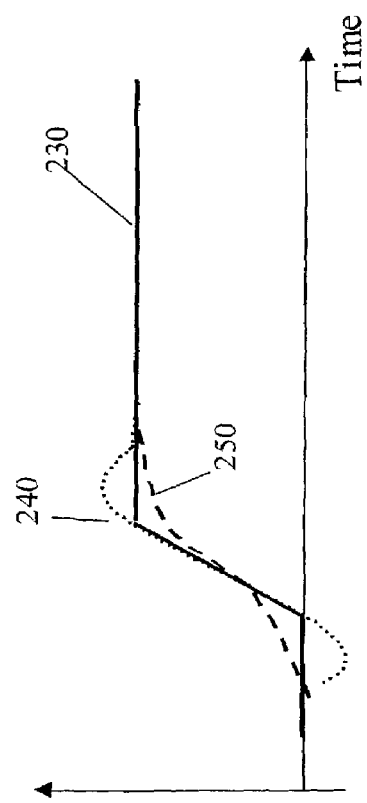
FIG. 2b illustrates various waveform responses as a result of the SAW filter.
Figure 3:
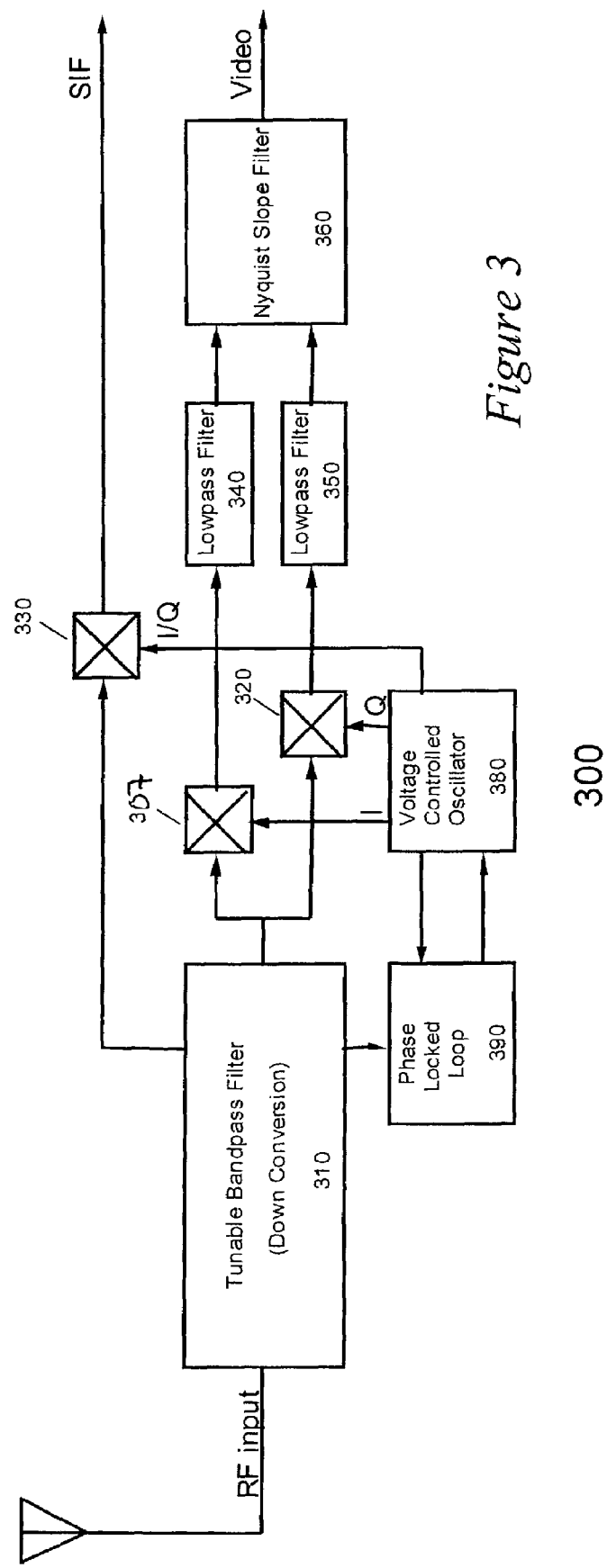
FIG. 3 is a block diagram illustrating one embodiment for a receiver that incorporates the filter of the present invention.

FIG. 3 is a block diagram illustrating one embodiment for a receiver that incorporates the filter of the present invention. A receiver circuit 300 receives, as an input, a radio frequency ("RF") television signal, and generates, as outputs, a baseband video signal ("video") and an IF sound signal ("SIF"). In general, receiver 300 includes a downconverter/tunable filter 310 to convert the RF television signal to an IF signal. The receiver 300 also includes a demodulator circuit to demodulate the IF signal to generate the video and SIF signals.

For this embodiment, the down conversion function is performed by downconverter 310, phase locked loop 390, and voltage controlled oscillator 380. In general, downconverter 310 converts the RF input signal to an IF signal through use of the voltage controlled oscillator 380. The phase locked loop 390 locks the phases of the input RF signal to the phase of the local oscillator signal.

If receiver 300 employs a direct demodulation scheme, downconverter 310 is replaced with a tunable bandpass filter. In general, in a direct demodulation scheme, the RF signal is directly demodulated (i.e., the input to the demodulator is the filtered RF signal). The tunable bandpass filter 310 filters the RF signal for the tuned channel of receiver 300.

The IF signal or RF signal for the direct demodulation embodiment, output from the tunable bandpass filter/downconverter 310, is input to the RF ports of mixers 307 and 320. As shown in FIG. 3, voltage controlled oscillator 380 generates two signals: an in-phase local oscillator signal ("I") and a quadrature phase local oscillator signal ("Q"). The Q signal is phase shifted 90 degrees from the I signal. The mixers 307 and 320 generate a baseband signal from the intermediate frequency television signal and the I/Q local oscillator signals at both in-phase and quadrature phases.

The demodulator portion of receiver 300 also includes mixer 330 to extract the sound intermediate frequency carrier ("SIF"). As shown in FIG. 3, the conditioned RF input signal (direct demodulation) or the downconverted IF signal is input to an RF port on mixer 330. The voltage controlled oscillator 380 is coupled to mixer 330 to drive the LO port. The mixer 330 mixes the conditioned RF/downconverted IF signal and local oscillator signal to generate the sound intermediate frequency signal as an output component.

As shown in FIG. 3, the demodulator portion of the receiver also includes low pass filters (340 and 350) as well as Nyquist slope filter 360. As described more fully below, the total response from low pass filters (340 and 350) and Nyquist slope filter 360 generates a demodulated baseband television signal. Specifically, the Nyquist slope filter generates a Nyquist slope response and rejects channels adjacent to the tuned channel.

FIG. 4 is a block diagram illustrating one embodiment for the U/V tuner (U/V tuner 310, FIG. 3) in the television receiver. For this embodiment, U/V tuner 310 performs a double down conversion. As shown in FIG. 4, an RF television signal is input to the U/V tuner. The RF television signal has a single fundamental frequency in the range of 55 MHz to 880 MHz. For this embodiment, a first down conversion circuit includes tunable bandpass filters 410 and 430, automatic gain control ("AGC") circuits 420 and 440, local oscillator circuit 445, and mixer 450. The first down conversion circuit processes the RF television signal to convert the signal to a first intermediate frequency of 45.75 MHz (i.e., down converts from a range of input frequencies, 55 MHz to 880 MHz, to the first IF frequency of 45.75 MHz). For example, if the input RF television signal comprises a fundamental frequency of 880 MHz, the first down conversion circuit down converts an 880 MHz RF signal to a first intermediate frequency signal of 45.75 MHz. Similarly, if the input RF signal comprises a fundamental frequency of 220 MHz, then the first down conversion circuit generates a first intermediate frequency signal of 45.75 MHz.

A band of RF frequencies is converted to the first IF frequency. In order to convert the range of frequencies, the local oscillator 445 (FIG. 4) generates a variable local oscillator signal. The local oscillator signal has a range of frequencies between 925.75 MHz and 100.75 Mhz. For example, if the input RF signal has a fundamental frequency of 880 MHz, then the local oscillator 445 is tuned to generate a signal at 925.75 MHz to produce a first intermediate frequency at the output of mixer 450 of 45.75 MHz (i.e., 925.75 MHz–880 MHz).

An image signal, $f_1$, is an output product of mixer 450 (i.e., the image signal, $f_1$, results from mixing the RF signal with the local oscillator signal of local oscillator 445). For example, an RF input signal with a fundamental frequency of 55 MHz is mixed with a local oscillator having a frequency of 100.75 MHz to produce a first harmonic at 45.75 MHz (RF (100.75 Mhz)–LO (55 Mhz)=45.75 Mhz). In turn, this first harmonic, centered around 45.75 MHz, mixes with the local oscillator frequency of 100.75 MHz to produce an image at 155.75 MHz (45.75 Mhz+100.75

Mhz=155.75 Mhz). The image frequencies require suppression for proper operation of the circuit.

For the embodiment of FIG. 4, the first down conversion circuit includes tunable bandpass filters 410 and 430. The band pass filter 410 is tuned based on the input RF signal frequency. The bandpass filter 430 is selectively tuned to filter, at a center frequency, between the range of 55 MHz and 880 MHz, the fundamental frequencies of the input RF signals.

A second down conversion circuit, which includes IF bandpass filter 460, AGC circuit 470, mixer 480, and local oscillator 475, converts RF signals from the first intermediate frequency (45.75 MHz) to a second intermediate frequency (10.5 MHz). The IF2 composite filter 485 processes the IF2 television signal for extraction of the tuned channel sound carrier ($F_s$) and the tuned channel picture carrier ($F_p$). An AGC circuit 490 provides additional gain for the color carrier frequency.

FIG. 5 is a block diagram illustrating another embodiment for the U/V tuner. For this embodiment, the U/V tuner (310, FIG. 3) utilizes a single down conversion scheme. For this embodiment, a single down conversion circuit includes tunable bandpass filters 510 and 520, automatic gain control ("AGC") circuits 515, 525, 545, and 580, local oscillator circuit 535, and mixer 530. The single down conversion circuit processes the RF television signal to convert the signal to an intermediate frequency of 20 MHz (i.e., down converts from a range of input frequencies, 55 MHz to 880 MHz, to the IF frequency of 20 MHz). For example, if the input RF television signal comprises a fundamental frequency of 880 MHz, the first down conversion circuit down converts an 880 MHz RF signal to an intermediate frequency signal of 20 MHz.

A band of RF frequencies is converted to the IF frequency. In order to convert the range of frequencies, the local oscillator 535 (FIG. 5) generates a variable local oscillator signal. The local oscillator signal has a range of frequencies between 860 MHz and 35 MHz. For example, if the input RF signal has a fundamental frequency of 880 MHz, then the local oscillator 535 is tuned to generate a signal at 860 MHz to produce the intermediate frequency at the output of mixer 530 of 20 MHz (i.e., 880 MHz–860 MHz).

The IF1 bandpass filter 540 filters the IF television signal for the IF frequency of 20 MHz. The AGC 545 circuit provides gain for the IF television signal, and the IF1 composite filter 550 processes the IF1 television signal for extraction of the tuned channel sound carrier ($F_s$) and the tuned channel picture carrier ($F_p$). An AGC circuit 560 provides additional gain for the color carrier frequency.

Figure 6:
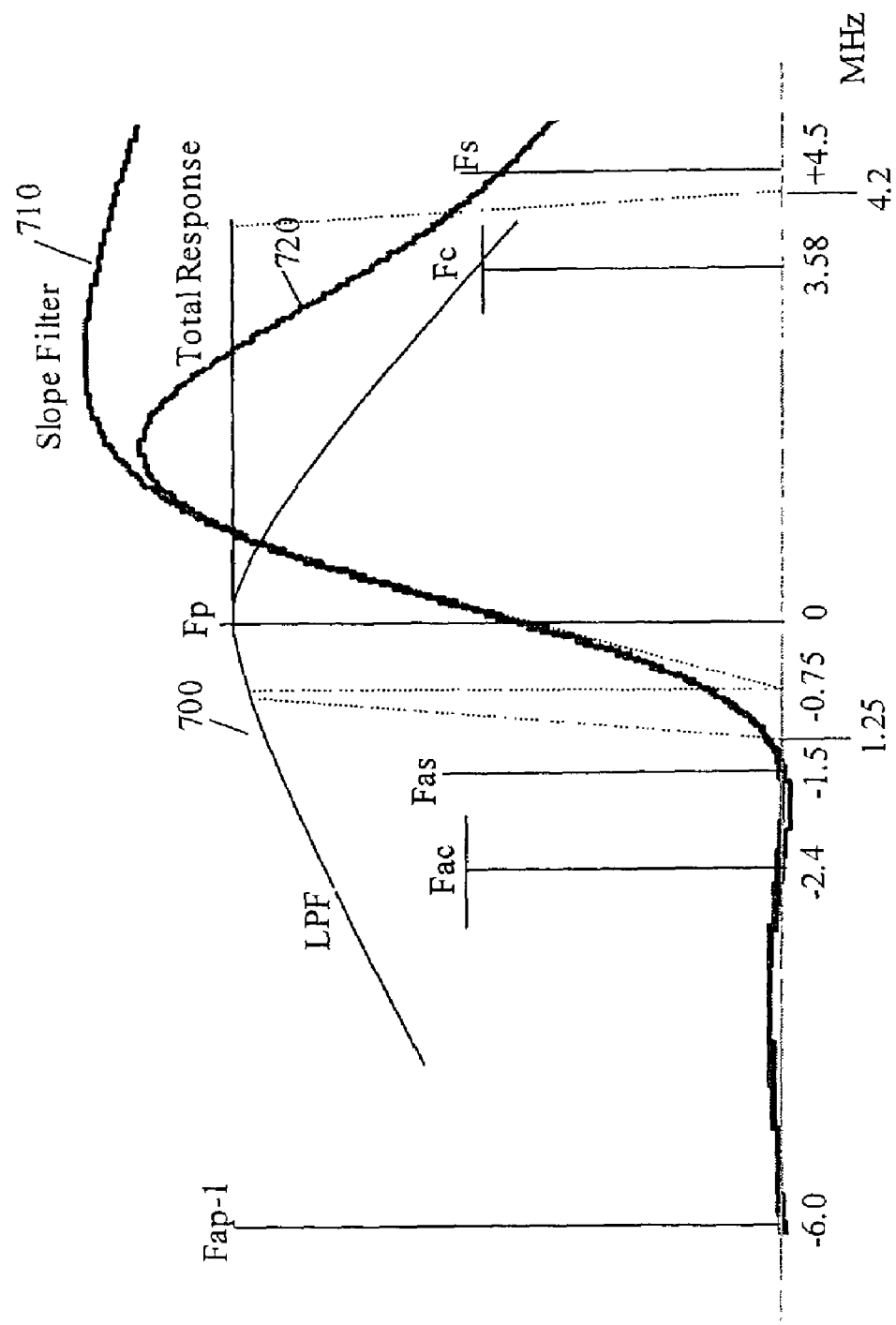
FIG. 6 illustrates a frequency response realized by one embodiment of the Nyquist slope filter.

FIG. 6 illustrates a frequency response realized by one embodiment of the Nyquist slope filter. FIG. 6 shows a waveform of a six (6) MHz channel for tuning by the television receiver. The channel includes a picture component, modulated on a picture carrier frequency ($F_p$), a color component, modulated on a color carrier frequency ($F_c$), and a sound component modulated on a sound carrier frequency ($F_s$). The television channel waveform shown in FIG. 6 is a baseband television signal. Thus, the picture carrier frequency ($F_p$) is at 0 MHz, the color carrier frequency is at 3.58 MHz, and the sound carrier frequency is at 4.5 MHz.

FIG. 6 also shows a channel adjacent to the tuned television channel (e.g., the adjacent channel at a lower frequency). The relative components of the adjacent channel are shown relative to the tuned channel. Specifically, the adjacent sound carrier ($F_{as}$) is shown at 1.5 MHz below the picture carrier of the tuned channel. Also, the adjacent color carrier ($F_{ac}$) and adjacent picture carrier frequency ($F_{ap-1}$) are shown at –2.4 MHz and –6.0 MHz, respectively, below the picture carrier frequency for the tuned channel.

As shown in FIG. 6, the Nyquist slope filter of the present invention realizes close to an ideal Nyquist slope response. The Nyquist slope frequency response is shown as curve 710 in FIG. 6. As shown in FIG. 6, the Nyquist slope frequency response crosses the picture frequency carrier at 0 MHz so as to attenuate approximately half (0.5) of the total energy of the television channel at the picture frequency carrier.

The Nyquist slope filter of the present invention also provides adjacent channel rejection. In one embodiment, the Nyquist slope filter response includes at least two zero crossings. For the embodiment shown in FIG. 6, the Nyquist slope filter response includes three zero crossings. This response provides three notch filters to reject the adjacent television channel. In one embodiment, the Nyquist slope filter includes notch filters to maximize suppression of the adjacent channel at the picture, color carrier, and sound carrier frequency components. Specifically, as shown in FIG. 6, the Nyquist slope filter response includes three zero row crossings: –0.5 MHz (adjacent sound carrier frequency), –2.4 MHz (adjacent color carrier frequency), and –6.0 MHz (adjacent picture carrier frequency).

FIG. 6 also depicts (response curve 700) an example frequency response for the low pass filters (e.g., low pass filters 340 and 350, FIG. 3). For this embodiment, the low pass filter response 700 has a center pass frequency centered around the picture carrier frequency (0 Mhz) for the tuned channel. A third response curve, labeled 720 in FIG. 6, represents the total transfer response for the low pass filters and the Nyquist slope filter (i.e., a combination of the response from curves 700 and 710).

Figure 7:
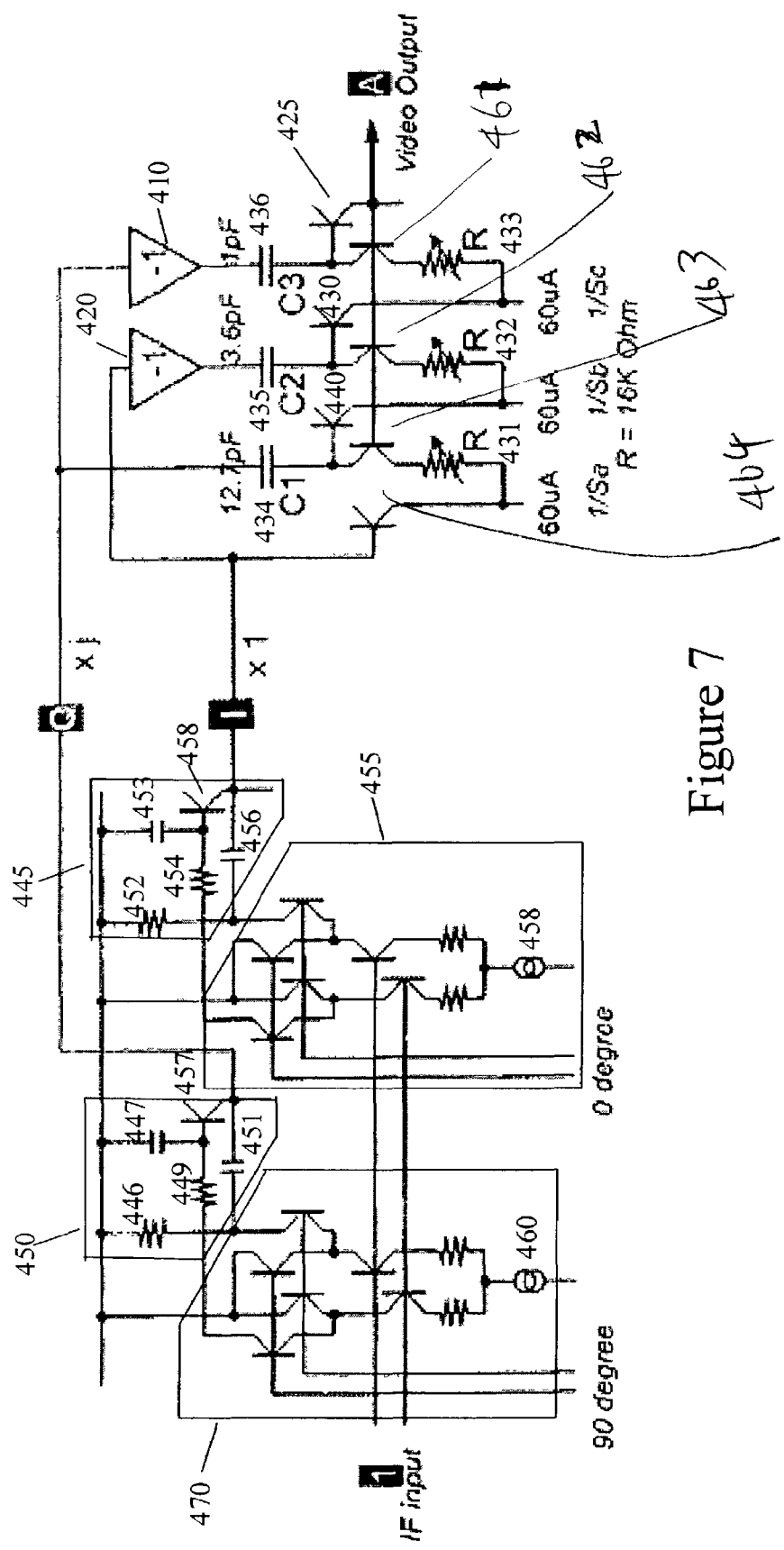
FIG. 7 illustrates one embodiment for the demodulator circuit of the present invention.

FIG. 7 illustrates one embodiment for the demodulator circuit of the present invention. For this embodiment, the mixer 307 (FIG. 3) is implemented with double balanced mixer 455, and mixer 320 (FIG. 3) is implemented with double balanced mixer 470. As shown in FIG. 7, differential inputs of in-phase local oscillator signal, I signal, are input to double balanced mixer 455, and differential inputs of quadrature phase local oscillator signal, Q signal, are input to double balanced mixer 470. Differential IF inputs (e.g., output of tunable bandpass filter 310) are input to both double balanced mixers 455 and 470. Double balanced mixers 455 and 470 are biased with current sources 458 and 460, respectively.

The differential outputs of double balanced mixer 470 (Q channel) are input to low pass filter 450. Similarly, the differential outputs of double balanced mixer 455 (I channel) are input to low pass filter 445. In one embodiment, the low pass filters (445 and 450) are configured as Butterworth lowpass filters. For this embodiment, low pass filter 450 consists of resistors 446 and 449, capacitors 451 and 447, and bipolar transistor 457. Similarly, low pass filter 445 consists of resistors 452 and 454, capacitors 453 and 456, and bipolar transistor 458. As shown in FIG. 7, the output of low pass filter 450 is a filtered baseband Q signal, and the output of low pass filter 445 is a filtered baseband I signal.

In one embodiment, the transfer function, expressed in the S domain, of the Butterworth lowpass filter for the I channel follows.

$$I = 1 \times \frac{1}{1 + 1.4 \times S + S \times S}$$

The transfer function, also expressed in the S domain, of the Butterworth lowpass filter for the Q channel may be expressed as:

$$Q = j \times \frac{1}{1 + 1.4 \times S + S \times S}$$

wherein, $S = j \times \frac{F}{3 \text{ Mhz}}$.

FIG. 7 also illustrates one embodiment for the quadratic Nyquist slope filter of the present invention. In one embodiment, the Nyquist slope filter comprises a quadratic filter. The Nyquist slope filter provides close to an ideal Nyquist slope through use of quadratic I, Q demodulators. For this embodiment, the quadratic slope filter includes two inverters (410 and 420). The invertors invert in-phase (I) and quadrature phase (Q) signals to generate a negative I and Q signals. The negative I and Q signals, along with the positive I and Q signals, constitute the differential I, Q pair. The differential I, Q pair is input to the quadratic Nyquist slope filter. For this embodiment, the Nyquist slope filter is implemented with capacitors 434, 435, and 436 and resistors 431, 432, and 433. A plurality of transistors (425, 430, 440, 461, 462, 463, and 464) are also used to construct the Nyquist slope filter. In one embodiment, the transistors comprise bipolar transistors. Specifically, the emitter of BJT transistors 461, 462, and 463 are coupled to a constant current source through variable resistors 433, 432, and 431, respectively. In one embodiment, the constant current source generates a current of sixty (60) micro amperes (uA), and the variable resistors are set to a value of 16 kilo ohms. As shown in FIG. 7, capacitor 434 couples the positive Q input to the base of transistor 440, capacitor 435 couples the negative I input to the base of transistor 440, and capacitor 436 couples the negative Q input to the base of transistor 425. In one embodiment, capacitor 434 has a value of 12.7 pica farads (pF), capacitor 435 has a value of 3.60 pF, and capacitor 436 has a value of 1 pF (i.e., C1=12.7 pF, C2=3.6 pF, and C3=1 pF).

In one embodiment, the transfer function for the Nyquist slope filter comprises an all-pass filter. The transfer function is expressed in the S domain. The transfer function is at least a second order function. In one embodiment, the transfer function includes a real number in the numerator and a complex number in the denominator. The Nyquist slope filter comprises inverters so that the transfer function includes only terms in the numerator with the same sign. Specifically, the Nyquist slope filter transfer function may be expressed as:

$$A = \frac{1 + j \times S1 - S1 \times S2 - j \times S1 \times S2 \times S3}{1 + S1 + S1 \times S2 + S1 \times S2 \times S3}$$

wherein, $S1 = jwC1R$ $S2 = jwC2R$ $S3 = jwC3R$.

This denominator may be factored as follows.

$1 + S1 + S1 \times S2 + S1 \times S2 \times S3 = (1 + Sa) \times (1Sb) \times (1Sc)$ Thus, the filter transfer function may also be expressed as:

$$A = \frac{(1 + Za) \times (1 + Zb) \times (1 + Zc)}{(1 + Sa) \times (1 + Sb) \times (1 + Sc)}$$

wherein, $Sa = j \times Za = j \times \frac{F}{1.5 \text{ Mhz}}$ $Sb = j \times Zb = j \times \frac{F}{2.4 \text{ Mhz}}$ $Sc = j \times Zc = j \times \frac{F}{6 \text{ Mhz}}$.

Figure 8:
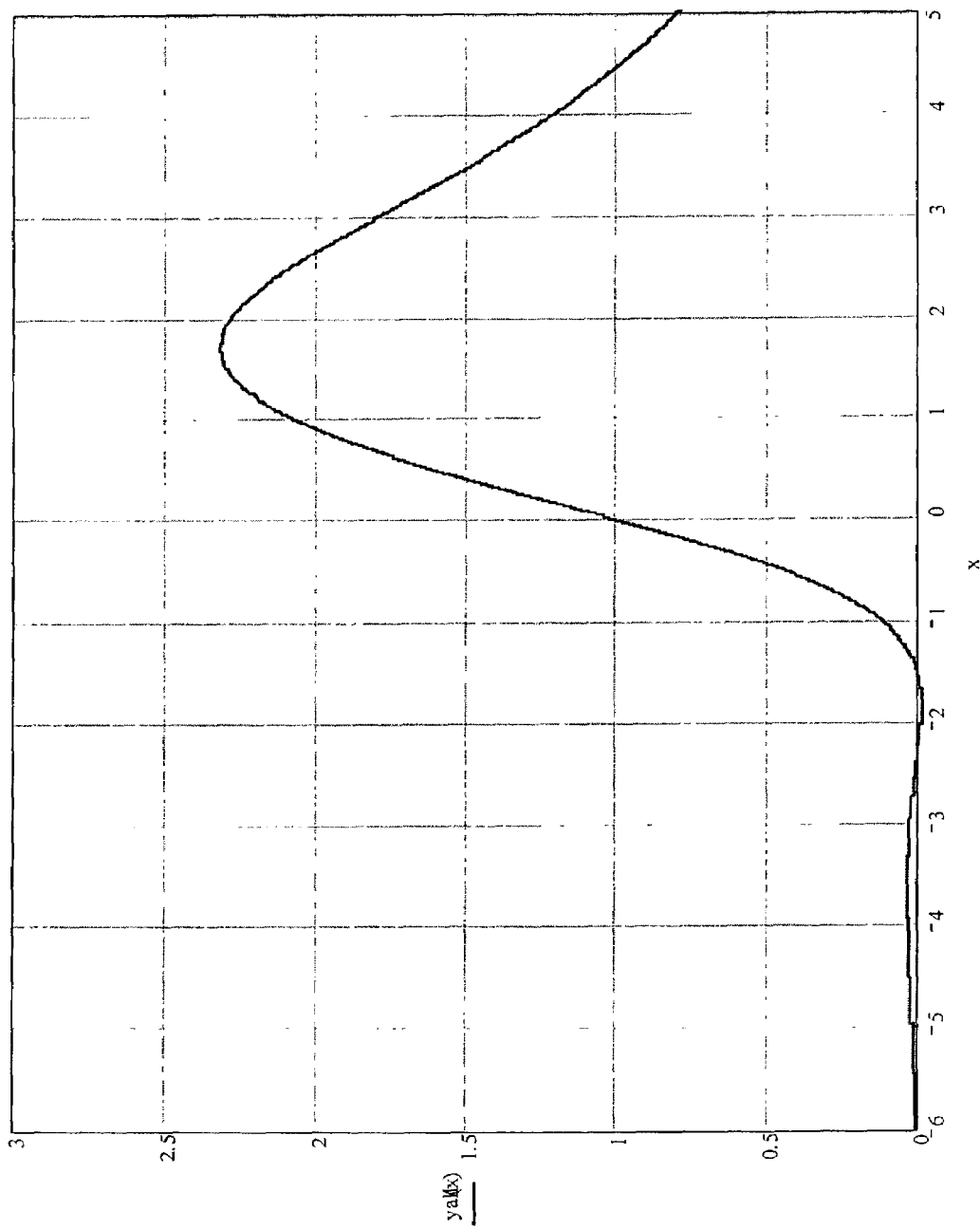
FIG. 8 illustrates one embodiment of a total response curve for the low pass filters and Nyquist slope filter.

FIG. 8 illustrates one embodiment of a total response curve for the low pass filters and Nyquist slope filter. The response curve is applied to filter the television signal at baseband. The frequency response curve of FIG. 8 is normalized to the frequency, x, shown on the x-axis. The attenuation yall(x) is shown as a function of x. For the Butterworth low pass filter embodiment, the transfer function of the low pass filter, realized as a function of X, may be expressed as:

$$LPF = \frac{1}{\sqrt{1 + (X/3)^4}}$$

The Nyquist slope transfer function may be expressed as:

$$NSlope = \frac{\left(1 + \frac{X}{1.5}\right) \times \left(1 + \frac{X}{2.4}\right) + \left(1 + \frac{X}{6}\right)}{\sqrt{\left\{1 + \left(\frac{X}{1.5}\right)^2\right\} \times \left\{1 + \left(\frac{X}{2.4}\right)^2\right\} \times \left\{1 + \left(\frac{X}{6}\right)^2\right\}}}$$

The Nyquist slope filter of the present invention has several advantages over implementing the Nyquist slope in the IF SAW filter. As discussed above in the Background of the Invention section, the SAW filter requires an adjustment in order to track the input frequency with the bandpass characteristics of the SAW filter. In contrast, no tracking or tuning of the Nyquist slope filter is required. In addition, the IF SAW filter implementation introduces group delay in the television signal. No such group delay is introduced through use of the Nyquist slope filter. The SAW filter also generates a large insertion loss for the television signal, between 12–20 dB. Furthermore, the IF SAW filter has a large thermal dependency. The thermal dependency in the SAW filters causes tracking problems for tuning.

Using the Nyquist slope filter of the present invention, no tracking or tuning is required if the I, Q demodulator is phase locked to the input signal. The Nyquist slope filter provides a better Nyquist slope and adjacent channel rejection than the SAW filter implementation. Furthermore, there is no significant signal loss in the Nyquist slope filter. Thus, a 55 dB signal to noise ratio, required to eliminate distortion perceived by a human, is easy to achieve.

What is claimed is:

1. A television demodulator circuit comprising:
   I, Q demodulator for receiving a television signal and for mixing the television signal with an in-phase ("I") local oscillator signal and a quadrature phase ("Q") local oscillator signal at a tuned television channel to generate a baseband I signal and a baseband Q signal;

low pass filter, coupled to the I, Q demodulator, for filtering the baseband I signal and baseband Q signal; and Nyquist slope filter for receiving the baseband I signal and baseband Q signal and for generating a video signal by generating a Nyquist slope response and by attenuating channels adjacent to the tuned television channel, wherein the Nyquist slope filter comprises a transfer function with at least two zero crossings, so as to provide a notch filter response for attenuation of a television channel adjacent to the tuned television channel.

2. The television demodulator circuit as set forth in claim 1, wherein the transfer function with at least two zero crossings comprises transfer function with a zero crossing at a sound carrier frequency for the television channel adjacent to the tuned television channel.

3. The television demodulator circuit as set forth in claim 1, wherein the transfer function with at least two zero crossings comprises a transfer function with three zero crossings to attenuate a sound carrier frequency, a color carrier frequency, and a picture frequency for the television channel adjacent to the tuned television channel.

4. The television demodulator circuit as set forth in claim 1, wherein a transfer function for said Nyquist slope filter comprises a real number in the numerator and a complex number in the denominator.

5. The television demodulator circuit as set forth in claim 1, wherein the low pass filter comprises a low pass filter with a Butterworth response.

6. A television demodulator circuit comprising:

I, Q demodulator for receiving a television signal and for mixing the television signal with an in-phase ("I") local oscillator signal and a quadrature phase ("Q") local oscillator signal at a tuned television channel to generate a baseband I signal and a baseband Q signal;

low pass filter, coupled to the I, Q demodulator, for filtering the baseband I signal and baseband Q signal; and Nyquist slope filter for receiving the baseband I signal and baseband Q signal and for generating a video signal by generating a Nyquist slope response and by attenuating channels adjacent to the tuned television channel, wherein said Nyquist slope filter comprises an all-pass fractional transfer function.

7. The television demodulator circuit as set forth in claim 6, wherein a transfer function for said Nyquist slope filter comprises a real number in the numerator and a complex number in the denominator.

8. The television demodulator circuit as set forth in claim 6, wherein the low pass filter comprises a low pass filter with a Butterworth response.

9. A television demodulator circuit comprising:

I, Q demodulator for receiving a television signal and for mixing the television signal with an in-phase ("I") local oscillator signal and a quadrature phase ("Q") local oscillator signal at a tuned television channel to generate a baseband I signal and a baseband Q signal;

low pass filter, coupled to the I, Q demodulator, for filtering the baseband I signal and baseband Q signal; and Nyquist slope filter for receiving the baseband I signal and baseband Q signal and for generating a video signal by generating a Nyquist slope response and by attenuating channels adjacent to the tuned television channel, wherein the Nyquist slope filter comprises inverters, such that a transfer function for the Nyquist slope filter comprises terms of the numerator with the same sign.

10. The television demodulator circuit as set forth in claim 9, wherein a transfer function for said Nyquist slope filter comprises a real number in the numerator and a complex number in the denominator.

11. The television demodulator circuit as set forth in claim 9, wherein the low pass filter comprises a low pass filter with a Butterworth response.

* * * * *